US010827606B2

(12) United States Patent
Chen et al.

(10) Patent No.: US 10,827,606 B2
(45) Date of Patent: Nov. 3, 2020

(54) LENS MODULE HAVING PHOTOSENSITIVE CHIP EMBEDDED IN THROUGH HOLE OF CIRCUIT BOARD AND ASSEMBLY METHOD THEREOF

(71) Applicant: TRIPLE WIN TECHNOLOGY(SHENZHEN) CO. LTD., Shenzhen (CN)

(72) Inventors: Shin-Wen Chen, New Taipei (TW); Long-Fei Zhang, Guangdong (CN); Ke-Hua Fan, Shenzhen (CN); Kun Li, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/255,352

(22) Filed: Jan. 23, 2019

(65) Prior Publication Data
US 2020/0205282 A1    Jun. 25, 2020

(30) Foreign Application Priority Data
Dec. 21, 2018   (CN) .......................... 2018 1 1575092

(51) Int. Cl.
*H01L 27/146*   (2006.01)
*H05K 1/02*    (2006.01)
(Continued)

(52) U.S. Cl.
CPC ............. *H05K 1/0274* (2013.01); *G02B 5/20* (2013.01); *G02B 7/02* (2013.01); *H01L 27/1469* (2013.01);
(Continued)

(58) Field of Classification Search
CPC ......... H01L 27/14625; H01L 27/14634; H01L 27/14636; H01L 27/14685;
(Continued)

(56) References Cited

U.S. PATENT DOCUMENTS

| 8,836,855 B2 * | 9/2014 | Chen .................... H04N 5/2251 348/374 |
| 2007/0096280 A1 * | 5/2007 | Tu ..................... H01L 31/02325 257/680 |

(Continued)

FOREIGN PATENT DOCUMENTS

| CN | 204992066 U | 1/2016 |
| TW | 200905815 A | 2/2009 |
| TW | 201229605 A | 7/2012 |

*Primary Examiner* — Stephen W Smoot
(74) *Attorney, Agent, or Firm* — ScienBiziP, P.C.

(57) ABSTRACT

A lens module includes a circuit board, a photosensitive chip, a mounting bracket, a filter, a lens base, and a lens. The circuit board defines a first through hole. The photosensitive chip is mounted within the first through hole. Gold fingers are mounted on the circuit board surrounding the photosensitive chip. Metal wires are mounted on a periphery of the photosensitive chip. Each of the metal wires is coupled to a corresponding one of the gold fingers. The metal wires are encapsulated by a colloid so that the metal wires do not contact each other. The mounting bracket is mounted on the circuit board. The filter is mounted on the mounting bracket and aligned with the photosensitive chip. The lens base is mounted on the mounting bracket. The lens is mounted within the lens base and aligned with the photosensitive chip.

14 Claims, 4 Drawing Sheets

(51) Int. Cl.
*G02B 5/20* (2006.01)
*H05K 1/18* (2006.01)
*G02B 7/02* (2006.01)
*H01L 31/0232* (2014.01)
*H01L 31/0203* (2014.01)

(52) U.S. Cl.
CPC .. *H01L 27/14625* (2013.01); *H01L 27/14634* (2013.01); *H01L 27/14636* (2013.01); *H01L 27/14685* (2013.01); *H01L 31/0203* (2013.01); *H01L 31/02325* (2013.01); *H05K 1/189* (2013.01)

(58) Field of Classification Search
CPC ........... H01L 27/14687; H01L 27/1469; H01L 31/0203; H01L 31/02162; H01L 31/02325; H01L 31/1864; G02B 5/20; G02B 7/02; H05K 1/0274; H05K 1/189
See application file for complete search history.

(56) References Cited

U.S. PATENT DOCUMENTS

| | | | | |
|---|---|---|---|---|
| 2007/0158538 | A1* | 7/2007 | Wang | H01L 31/0203 |
| | | | | 250/239 |
| 2014/0353789 | A1* | 12/2014 | Oganesian | H01L 23/053 |
| | | | | 257/432 |
| 2015/0214416 | A1* | 7/2015 | Ho | H01L 27/14618 |
| | | | | 438/65 |
| 2017/0280027 | A1* | 9/2017 | Wang | H05K 3/284 |
| 2019/0387157 | A1* | 12/2019 | Chen | H04N 5/2257 |
| 2019/0393113 | A1* | 12/2019 | Chen | H01L 27/14627 |
| 2019/0393362 | A1* | 12/2019 | Chen | H01L 31/0203 |

\* cited by examiner

LENS MODULE HAVING PHOTOSENSITIVE CHIP EMBEDDED IN THROUGH HOLE OF CIRCUIT BOARD AND ASSEMBLY METHOD THEREOF

FIELD

The subject matter herein generally relates to lens modules, and more particularly to a lens module and a method of assembly thereof.

BACKGROUND

Generally, lens modules of mobile phones include a lens, a lens holder, a mounting bracket, a filter, a photographic chip, and a circuit board. In assembly, the photosensitive chip is provided with a plurality of metal wires, and each of the metal wires is coupled to the circuit board. However, when the metal wires are long, disconnection or contact between different metal wires may occur, resulting in poor electrical performance of the lens module. Furthermore, when the lens module is used in a bright environment, light may pass through the filter and reflect off the metal wires onto the photosensitive chip, thereby affecting quality of a captured images.

BRIEF DESCRIPTION OF THE DRAWINGS

Implementations of the present disclosure will now be described, by way of embodiments, with reference to the attached figures.

DETAILED DESCRIPTION

Figure 1:
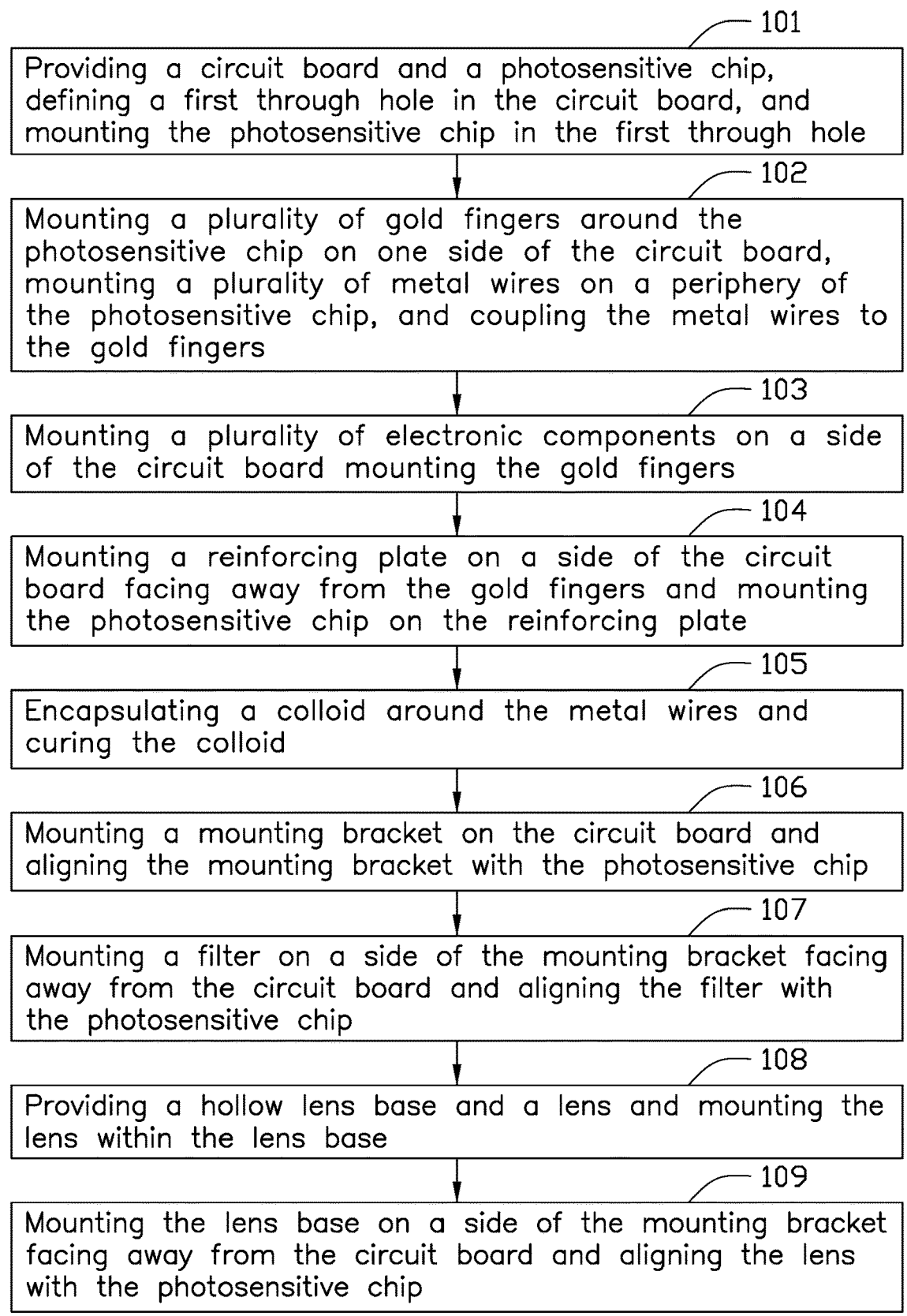
FIG. 1 is a flowchart of an embodiment of a method for assembling a lens module.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 shows a flowchart of an embodiment of a method for assembling a lens module.

At block S101, a circuit board and a photosensitive chip are provided. A first through hole is defined in the circuit board, and the photosensitive chip is received in the first through hole.

The circuit board may be a ceramic substrate, a flexible board, a hard board, or a flexible-hard composite board. In one embodiment, the circuit board is a soft board. The photosensitive chip may be a complementary metal oxide semiconductor (CMOS) chip or a charge coupled device (CCD) chip.

At block S102, a plurality of gold fingers are mounted around the photosensitive chip on one side of the circuit board, and a plurality of metal wires are mounted on a periphery of the photosensitive chip. The metal wires are coupled to the gold fingers.

In one embodiment, the metal wires are made of a metal having high electrical conductivity, such as gold.

At block S103, a plurality of electronic components are mounted on a side of the circuit board mounting the gold fingers.

At block S104, a reinforcing plate is mounted on a side of the circuit board facing away from the gold fingers, and the photosensitive chip is mounted on the reinforcing plate.

At block S105, a colloid is encapsulated and cured around the metal wires so that the metal wires do not contact each other.

The colloid may be applied separately to each of the metal wires or applied to the metal wires as a whole, as long as the colloid is cured and the metal wires do not contact each other. Block S105 as herein disclosed prevents the metal wires from breaking and contacting each other and preventing light from reflecting off the metal wires onto the photosensitive chip to enhance quality of a captured image.

At block S106, a mounting bracket is mounted on the circuit board and aligned with the photosensitive chip.

In one embodiment, the mounting bracket is substantially square, and a second through hole is defined in the mounting bracket. An inner wall of the second through hole forms an annular flange around a central axis of the second through hole.

At block S107, a filter is mounted on a side of the mounting bracket away from the circuit board. The filter is aligned with the photosensitive chip.

In one embodiment, the filter is mounted on a side of the flange facing away from the photosensitive chip, such that a surface of the filter facing away from the circuit board is substantially coplanar with a surface of the mounting bracket facing away from the circuit board.

At block S108, a hollow lens base and a lens are provided, and the lens is mounted within the lens base.

In one embodiment, the lens is made of resin, and the lens base is a voice coil motor.

At block S109, the lens base is mounted on a side of the mounting bracket facing away from the circuit board, and the lens is aligned with the photosensitive chip.

In one embodiment, the lens base is substantially hollow cuboid-shaped, and a shape and size of the lens base matches a shape and size of the mounting bracket.

According to different requirements, a sequence of the block of the above assembly method may be changed, and some steps may be omitted or combined. In one embodiment, block S104 may be omitted when the circuit board is not a flexible board.

Figure 2:
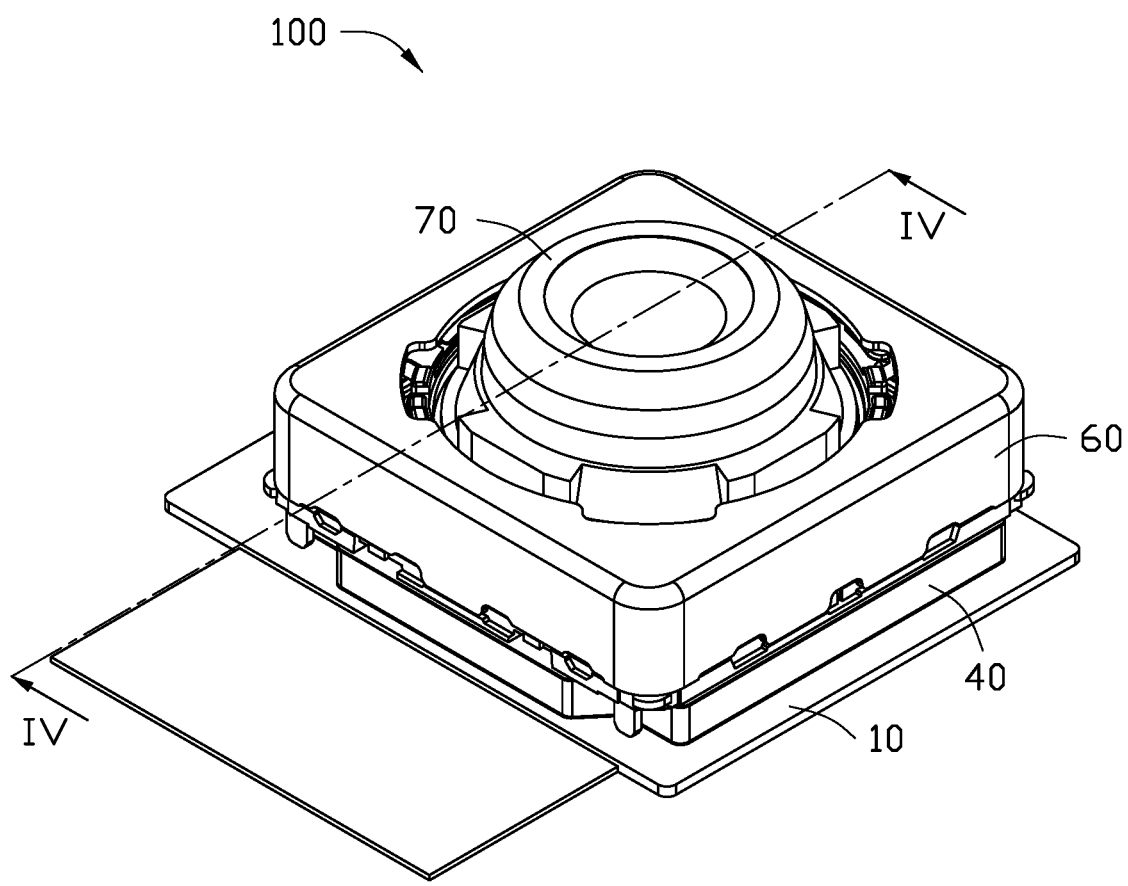
FIG. 2 is an isometric view of an embodiment of a lens module.
Figure 3:
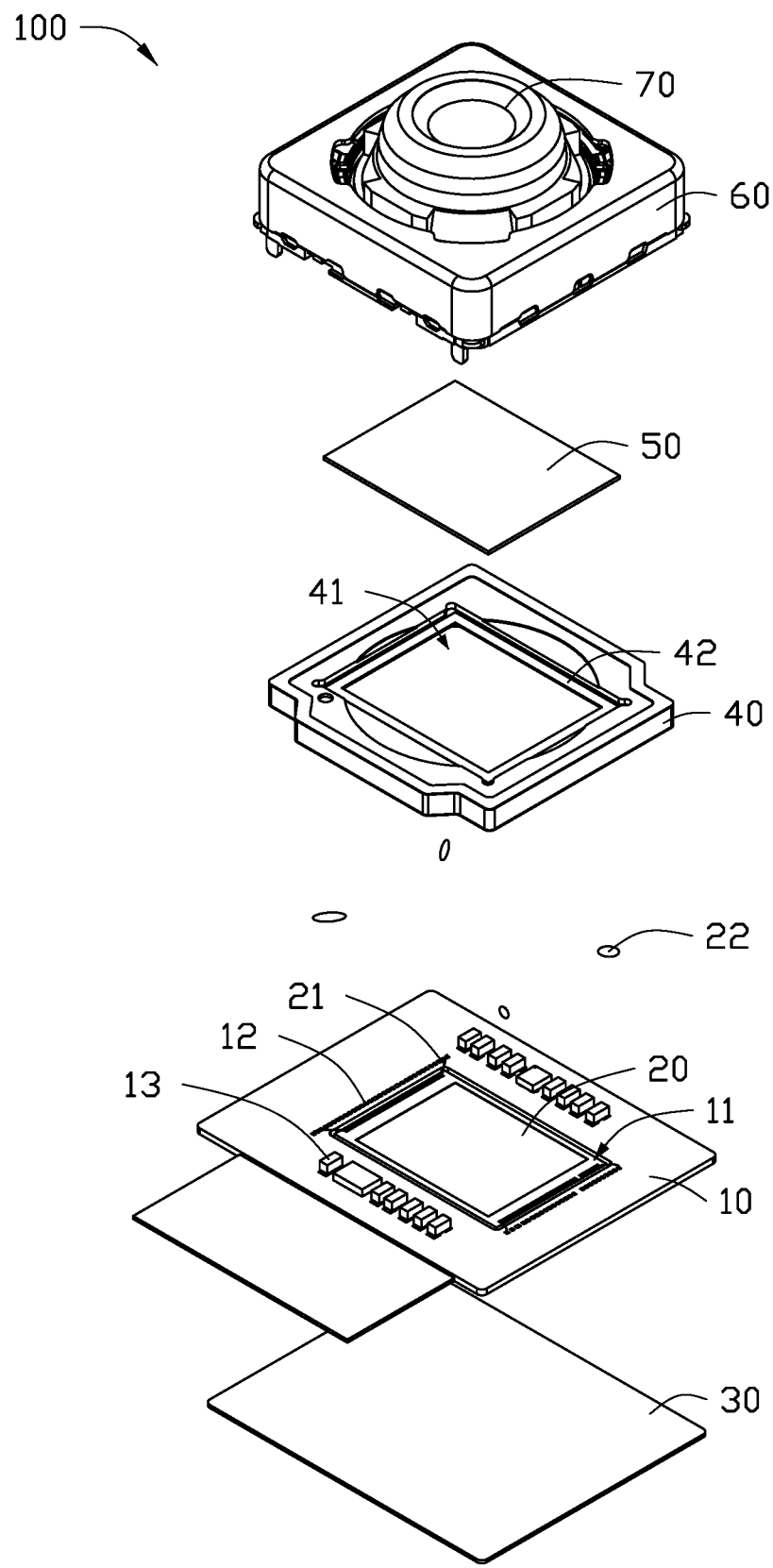
FIG. 3 is an exploded view of the lens module in FIG. 2.
Figure 4:
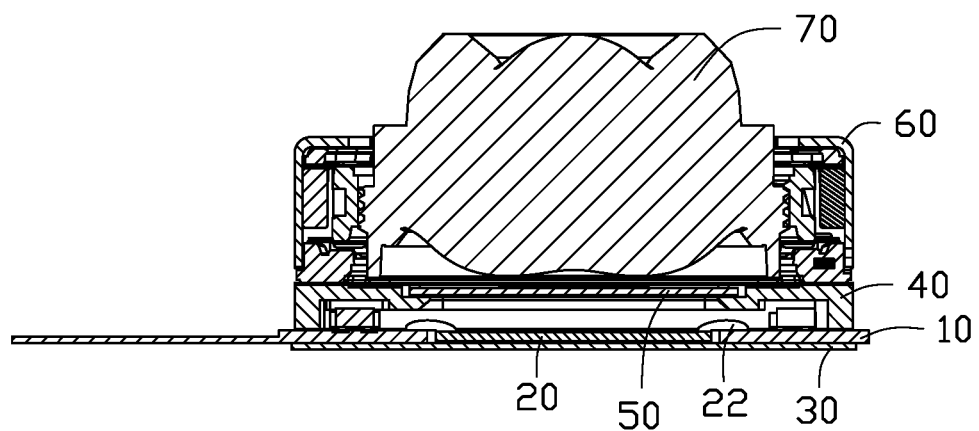
FIG. 4 is a cross-sectional view taken along line IV-IV in FIG. 2.

FIGS. 2-4 show an embodiment of a lens module 100 configured for an electronic device (not shown). The electronic device can be a smart phone, a tablet computer, or the like. The lens module 100 includes a circuit board 10, a photosensitive chip 20, a reinforcing plate 30, a mounting bracket 40, a filter 50, a lens base 60, and a lens 70.

A first through hole 11 is defined in the circuit board 10, and the photosensitive chip 20 is mounted in the first through hole 11. A plurality of gold fingers 12 and a plurality of electronic components 13 are mounted on one side of the circuit board 10, and the plurality of gold fingers 12 are arranged around the photosensitive chip 20. The electronic components 13 can be passive components such as a resistor, a capacitor, a diode, a transistor, a relay, or an electrically erasable programmable read only memory (EEPROM).

A plurality of metal wires 21 are mounted on a periphery of the photosensitive chip 20, and each of the metal wires 21 is coupled to a corresponding one of the gold fingers 12. Each of the metal wires 21 is encapsulated by a colloid 22, or the plurality of metal wires 21 are encapsulated as a whole by the colloid 22, as long as the metal wires 21 do not contact each other. The colloid 22 prevents the metal wires 21 from breaking and prevents light from reflecting off the metal wires 21 onto the photosensitive chip 20 to enhance quality of a captured image.

The reinforcing plate 30 is mounted on a side of the circuit board 10 facing away from the gold fingers 12, and the photosensitive chip 20 is mounted on the reinforcing plate 30. In one embodiment, the reinforcing plate 30 is made of stainless steel.

The mounting bracket 40 is substantially square and is mounted to the circuit board 10. The mounting bracket 40 defines a second through hole 41. An inner wall of the second through hole 41 forms an annular flange 42 surrounding a central axis of the second through hole 41.

The filter 50 is mounted to a side of the flange 42 facing away from the photosensitive chip 20 and is aligned with the photosensitive chip 20. A surface of the filter 50 facing away from the circuit board 10 is substantially coplanar with a surface of the mounting bracket 40 facing away from the circuit board 10. In one embodiment, the filter 50 is an infrared cut filter. The infrared cut filter is alternately plated with an optical film having a high refractive index on an optical substrate by a precision optical coating technique to realize a visible light region (400-630 nm), near-infrared (700-1100 nm) cut-off optical filter.

The lens 70 is mounted within the lens base 60. The lens base 60 is mounted to a side of the mounting bracket 40 facing away from the circuit board 10 such that the lens 70 is aligned with the photosensitive chip 20.

In use, the filter 50 is used to filter out infrared rays in an optical signal projected through the lens 70 onto a surface of the lens 70. The photosensitive chip 20 is configured to convert an optical signal after filtering the infrared rays projected onto the surface thereof into an electrical signal, and output the electrical signal to the circuit board 10 through the metal wires 21. The circuit board 10 processes the electrical signals to obtain a captured image.

Compared with the prior art, the lens module 100 is coated with a layer of colloid 22 on the metal wires 21. The metal wires 21 are prevented from contacting with each other, breaking apart, and further prevents light from reflecting off the metal wires 21 onto the photosensitive chip 20, thereby improving quality of captured images.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method of assembling a lens module, the method comprising:
   providing a circuit board and a photosensitive chip, defining a first through hole in the circuit board, and placing the photosensitive chip within the first through hole;
   mounting, on a side of the circuit board, a plurality of gold fingers surrounding the photosensitive chip, mounting a plurality of metal wires on a periphery of the photosensitive chip, and coupling each of the plurality of metal wires to a corresponding one of the plurality of gold fingers;
   encapsulating a colloid on the plurality of metal wires and curing the colloid so that the metal wires do not contact each other;
   mounting a mounting bracket on the circuit board and aligning the mounting bracket with the photosensitive chip;
   mounting a filter on a side of the mounting bracket facing away from the circuit board and aligning the filter with the photosensitive chip;
   providing a lens and a lens base and mounting the lens within the lens base; and
   mounting the lens base on a side of the mounting bracket facing away from the circuit board and aligning the lens with the photosensitive chip.

2. The method of claim 1, wherein a material of the plurality of metal wires is gold.

3. The method of claim 1 further comprising mounting a reinforcement plate on a side of the circuit board facing away from the gold fingers and mounting the photosensitive chip on the reinforcement plate.

4. The method of claim 1 further comprising mounting a plurality of electronic components on a side of the circuit board where the gold fingers are mounted.

5. The method of claim 1 further comprising defining a second through hole in the mounting bracket and forming an annular flange around an inner periphery of the second through hole.

6. The method of claim 5, wherein:
   the filter is mounted on the annular flange; and
   the filter is coplanar with a surface of the mounting bracket.

7. A lens module comprising:
   a circuit board;
   a photosensitive chip;
   a mounting bracket;
   a filter;
   a lens base; and
   a lens; wherein:
   the circuit board defines a first through hole;
   the photosensitive chip is mounted within the first through hole;
   a plurality of gold fingers are mounted on a side of the circuit board surrounding the photosensitive chip;

a plurality of metal wires are mounted on a periphery of the photosensitive chip;
each of the plurality of metal wires is coupled to a corresponding one of the plurality of gold fingers;
the plurality of metal wires are encapsulated by a colloid so that the metal wires do not contact each other;
the mounting bracket is mounted on the circuit board;
the filter is mounted on a side of the mounting bracket facing away from the circuit board and aligned with the photosensitive chip;
the lens base is mounted on a side of the mounting bracket facing away from the circuit board;
the lens is mounted within the lens base and aligned with the photosensitive chip.

8. The lens module of claim 7, wherein a material of the plurality of metal wires is gold.

9. The lens module of claim 7, wherein the circuit board is a flexible board.

10. The lens module of claim 9 further comprising a reinforcement plate mounted on a side of the circuit board facing away from the metal fingers, wherein the photosensitive chip is mounted on the reinforcement plate.

11. A lens module comprising:
a circuit board;
a photosensitive chip;
a mounting bracket;
a filter;
a lens base; and
a lens; wherein:
the circuit board defines a first through hole;
the photosensitive chip is mounted within the first through hole;
a plurality of gold fingers are mounted on a side of the circuit board surrounding the photosensitive chip;
a plurality of metal wires are mounted on a periphery of the photosensitive chip;
each of the plurality of metal wires is coupled to a corresponding one of the plurality of gold fingers;
the plurality of metal wires are encapsulated by a colloid so that the metal wires are separated from each other by the colloid;
the mounting bracket is mounted on the circuit board;
the filter is mounted on a side of the mounting bracket facing away from the circuit board and aligned with the photosensitive chip;
the lens base is mounted on a side of the mounting bracket facing away from the circuit board;
the lens is mounted within the lens base and aligned with the photosensitive chip.

12. The lens module of claim 11, wherein a material of the plurality of metal wires is gold.

13. The lens module of claim 11, wherein the circuit board is a flexible board.

14. The lens module of claim 13 further comprising a reinforcement plate mounted on a side of the circuit board facing away from the metal fingers, wherein the photosensitive chip is mounted on the reinforcement plate.

* * * * *